(12) United States Patent
Yu

(10) Patent No.: US 12,014,908 B2
(45) Date of Patent: Jun. 18, 2024

(54) VACUUM PROCESSING APPARATUS

(71) Applicant: Hitachi High-Tech Corporation, Tokyo (JP)

(72) Inventor: Shengnan Yu, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 625 days.

(21) Appl. No.: 17/277,024

(22) PCT Filed: Mar. 24, 2020

(86) PCT No.: PCT/JP2020/012880
§ 371 (c)(1),
(2) Date: Mar. 17, 2021

(87) PCT Pub. No.: WO2021/192001
PCT Pub. Date: Sep. 30, 2021

(65) Prior Publication Data
US 2022/0115217 A1  Apr. 14, 2022

(51) Int. Cl.
*H01J 37/32* (2006.01)
(52) U.S. Cl.
CPC .. *H01J 37/32733* (2013.01); *H01J 37/32724* (2013.01); *H01J 2237/20235* (2013.01)
(58) Field of Classification Search
CPC ................................................ H01L 21/67201
See application file for complete search history.

(56) References Cited

U.S. PATENT DOCUMENTS

| | | |
|---|---|---|
| 5,067,218 A | 11/1991 | Williams |
| 5,286,296 A | 2/1994 | Sato et al. |
| 5,695,564 A | 12/1997 | Imahashi |
| 5,897,710 A | 4/1999 | Sato et al. |
| 6,688,375 B1 * | 2/2004 | Turner .................... C23C 16/54 |
| | | 414/217 |

(Continued)

FOREIGN PATENT DOCUMENTS

| | | |
|---|---|---|
| JP | 2006273563 A | 10/2006 |
| JP | 2007511104 A | 4/2007 |

(Continued)

OTHER PUBLICATIONS

Search Report dated Jun. 9, 2020 in correponding International Application No. PCT/JP2020/012880.

*Primary Examiner* — Mark C Hageman
(74) *Attorney, Agent, or Firm* — Miles & Stockbridge, P.C.

(57) ABSTRACT

A vacuum processing apparatus with improved processing efficiency, which includes a pusher arm to support the wafer on a beam portion, or deliver the supported wafer, and a cooling plate disposed on a bottom in the lock chamber for cooling the wafer and placed on tip ends of multiple support pins. The pusher arm includes four pusher pins disposed around a center of the wafer to be placed on the horizontally extending beam portion, and a drive unit connected to the proximal part for vertically moving the beam portion. The cooling plate includes a recess portion in its center, into which the beam portion of the pusher arm which has been moved downward is stored. The support pins are positioned closer to an outer circumference side of the wafer on the cooling plate with respect to the center than the pusher pins of the pusher arm.

10 Claims, 4 Drawing Sheets

(56) References Cited

U.S. PATENT DOCUMENTS

| | | |
|---|---|---|
| 7,022,613 B2 | 4/2006 | Pomarede et al. |
| 7,024,266 B2 | 4/2006 | Edo |
| 7,210,246 B2 | 5/2007 | van der Me |
| 7,293,950 B2 | 11/2007 | Bonora et al. |
| 7,422,406 B2 | 9/2008 | van der Meulen |
| 7,458,763 B2 | 12/2008 | van der Meulen |
| 7,769,482 B2 | 8/2010 | Pannese et al. |
| 8,029,226 B2 | 10/2011 | van der Meulen |
| 8,747,046 B2 | 6/2014 | Somura et al. |
| 9,355,876 B2 * | 5/2016 | Reuter ............... H01L 21/6719 |
| 9,385,015 B2 | 7/2016 | Yamawaku et al. |
| 10,256,125 B2 * | 4/2019 | Weaver ............ H01L 21/67201 |
| 2005/0111956 A1 | 5/2005 | van der Meulen |
| 2005/0113964 A1 | 5/2005 | van der Meulen |
| 2005/0113976 A1 | 5/2005 | van der Meulen |
| 2005/0118009 A1 | 6/2005 | van der Meulen |
| 2005/0120578 A1 | 6/2005 | van der Meulen |
| 2006/0245852 A1 | 11/2006 | Iwabuchi |
| 2008/0138176 A1 | 6/2008 | Kim et al. |
| 2008/0170970 A1 | 7/2008 | Ito et al. |
| 2008/0187413 A1 | 8/2008 | Kondoh |
| 2008/0274288 A1 | 11/2008 | Kondo et al. |
| 2009/0067958 A1 | 3/2009 | van der Meulen |
| 2010/0189532 A1 | 7/2010 | Watanabe et al. |
| 2010/0199911 A1 | 8/2010 | Mizunaga |
| 2010/0297786 A1 | 11/2010 | Terashima et al. |
| 2011/0000232 A1 | 1/2011 | Yamazaki |
| 2011/0110751 A1 | 5/2011 | Tauchi et al. |
| 2011/0110752 A1 | 5/2011 | Tauchi et al. |
| 2011/0217148 A1 | 9/2011 | Nakata et al. |
| 2012/0027542 A1 | 2/2012 | Isomura et al. |
| 2012/0163943 A1 | 6/2012 | Isomura et al. |
| 2012/0170999 A1 * | 7/2012 | Sakaue ............ H01L 21/67739 414/217 |
| 2013/0183121 A1 | 7/2013 | Somura et al. |
| 2013/0343841 A1 | 12/2013 | van der Meulen |
| 2014/0271049 A1 | 9/2014 | Isomura et al. |
| 2014/0295672 A1 | 10/2014 | Tauchi |

FOREIGN PATENT DOCUMENTS

| | | |
|---|---|---|
| JP | 2008192840 A | 8/2008 |
| JP | 2009206270 A | 9/2009 |
| JP | 2010182906 A | 8/2010 |
| JP | 2011124564 A | 6/2011 |
| JP | 2012074496 A | 4/2012 |
| JP | 2012138542 A | 7/2012 |
| JP | 2013207014 A | 10/2013 |
| JP | 2014179431 A | 9/2014 |
| JP | 2014195008 A | 10/2014 |
| WO | 2005048313 A2 | 5/2005 |
| WO | 2012002499 A1 | 1/2012 |

* cited by examiner

VACUUM PROCESSING APPARATUS

TECHNICAL FIELD

The present invention relates to a vacuum processing apparatus including a vacuum processing unit for processing substrates to be processed such as semiconductor wafers in processing chambers inside a vacuum vessel, and a transport vessel connected to the vacuum processing unit to allow transport of the substrates to be processed therein. The apparatus further includes a lock chamber having an inner space connected to the transport vessel for storing the substrates to be processed. The pressure of the inner space is adjusted to be in the range between the low pressure in a predetermined vacuum degree and the high pressure approximately equal to the atmospheric pressure.

BACKGROUND ART

In the vacuum processing apparatus, the processing efficiency of the substrate-like sample such as the semiconductor wafer (hereinafter referred to as a wafer) as a processing target may be influenced by the following factors: capabilities of transporting wafers in parts constituting the vacuum processing apparatus, that is, the part to be brought into a substantially atmospheric pressure, and the part to be brought into the low temperature in the predetermined vacuum degree; capabilities of processing transported wafers in the vacuum processing unit; and the wafer transport control such as algorithm for setting the wafer transport path. Specifically, the influential factor includes: the number of cassettes having the wafers stored therein, which are connected to the vacuum processing apparatus; capability of the atmosphere transport robot for transporting wafers under the atmospheric pressure per unit time; the time necessary for emission and atmosphere release from the lock chamber; the capability of the vacuum transport robot for transporting the wafers under the low pressure per unit time; the number and arrangement of the processing units for processing the transported wafers therein; and the time necessary for processing wafers in the vacuum processing unit. For example, in any one of multiple units constituting the vacuum processing apparatus including the vacuum processing unit, the vacuum transport vessel, and the lock chamber, if the number of times for transporting wafers in the unit per unit time, and the number of wafers to which etching or asking is processed using plasma are sufficiently smaller than those derived from other units, the processing efficiency of the overall vacuum processing apparatus is limited by the operating capability of such unit. The number of wafers processed in the processing unit per unit time becomes the number of wafers processed in the vacuum processing apparatus per unit time.

The transport waiting time will occur in the respective units because of unevenness in operations and processing efficiencies of those units. The vacuum processing apparatus is, thus, demanded to improve overall productivity by dispersing such waiting time with uniformity. Japanese Patent Application Laid-Open No. 2013-207014 discloses the vacuum processing apparatus as the related art. The disclosed vacuum processing apparatus includes a plurality of vacuum transport chambers, a plurality of vacuum processing chambers connected to the vacuum transport chambers, respectively, intermediate storage chambers disposed between the respective vacuum transport chambers for communicably connecting those vacuum transport chambers, and the lock chamber connected to one of the vacuum transport chambers. The vacuum processing apparatus is configured to execute transport of wafers between the lock chamber connected to one of the vacuum transport chambers and the vacuum processing unit connected via the one vacuum transport chamber parallel to transport of wafers between the vacuum processing chamber connected to another one of the vacuum transport chambers and the intermediate storage chamber connected via the other vacuum transport chamber.

The disclosed apparatus is configured to execute the transport of wafers between the lock chamber and the one vacuum processing chamber parallel to the transport of wafers between the storage chamber and the other vacuum processing chamber so as to reduce the waiting time during the wafer transport, which is taken for transporting the wafer from the lock chamber to the target vacuum processing chamber for the processing until the processed wafer is returned to the lock chamber. The resultant increase in the number of the processed wafers per unit area occupied by the installed vacuum processing apparatus improves productivity.

CITATION LIST

Patent Literature

Patent Literature 1: Japanese Unexamined Patent Publication No. 2013-207014

SUMMARY OF INVENTION

Technical Problem

The related art as described above, however, still has the following problems. That is, it is configured to control the wafer transport, for example, the time taken for transporting the wafer to the target vacuum processing chamber so that the number of wafers to be processed per unit time is maximized, in other words, the optimum transport is achieved by performing the wafer transport between the storage chamber and the far-side vacuum processing chamber parallel to the wafer transport between the lock chamber and the front-side transport chamber. When transporting the high-temperature wafer which has been processed through asking under the high-temperature condition, such wafer may become the bottleneck in the lock chamber. The disclosed structure is configured in insufficient consideration of the optimum productivity efficiency, resulting in deterioration in the productivity per unit area occupied by the vacuum processing apparatus.

Especially when halogen gas or fluorine-containing gas is contained in the gas used for processing the membrane layer on the wafer surface in the processing chamber of the vacuum processing unit, for example, etching process, the substance adhering to the inner surface of the processing chamber or the wafer surface in the wafer processing, or the membrane formed as a result of deposit of the adhering substance may contain particles of such gas. The substance in the partially dissociated state may also be mixed. If the processed wafer is taken from the vacuum processing unit, and transported to the atmosphere via the vacuum transport vessel and the lock chamber while keeping the deposit and the membrane that contain particles retained, such deposit and the membrane absorb moisture by adsorbing vapor in the atmosphere such as air outside the vacuum processing apparatus, and generate hydrogen halide. This may cause the problem of corroding the membrane structure expected to constitute the circuit wiring of the semiconductor device formed on the wafer surface inside the processing unit. Especially, if the easily corrodible materials such as aluminum and aluminum alloys are used for producing the membrane layer to be processed, which has been preliminarily formed on the wafer surface, the problem of corrosion will frequently occur.

The deposition film removing step has been conventionally implemented by heating the processed wafer to the temperature ranging from 200 to 400° C. before it is exposed to the atmosphere, and supplying highly reactive particles onto the surface of the membrane layer of the processed wafer for interaction. When transporting the wafer processed at high temperatures into another chamber, upon contact of the high-temperature wafer with the suction arm at the tip end of the transport robot arm for vacuum holding of the wafer onto the surface, the resultant temperature difference may deform the wafer, failing to perform vacuum holding of the wafer on the arm. This may cause the wafer to fall from the arm, or the wafer to be caught in the valve of the vacuum vessel or the vacuum transport vessel for opening and closing the gate as the passage through which the wafer passes inside, resulting in damage to the wafer. The above-described failures significantly reduce reliability of the vacuum processing apparatus. The cassette which stores wafers is thermally deformed, resulting in difficulties in storage of wafers in the cassette.

The wafer processed at the high or low temperature is controlled to lower its temperature at the location before it is taken out to the atmospheric side, for example, in the state where the wafer is stored in the lock chamber, and taken out therefrom so as to be collected in the cassette. As the diameter of the wafer becomes large, heat capacity of the wafer is increased, requiring extension of time during which the wafer is stored in the lock chamber. As a result, the time taken for returning the processed wafer to the original cassette in the atmospheric side is prolonged, resulting in the problem of lowering efficiency of the operation and processing executed in the vacuum processing apparatus.

It is an object of the present invention to provide a vacuum processing apparatus with improved processing efficiency.

Solution to Problem

In order to solve the above-described problem, the present invention provides a vacuum processing apparatus which includes an atmosphere transport chamber, at least one vacuum transport chamber which is disposed at a back surface side of the atmosphere transport chamber, in which a vacuum transport robot is disposed for transporting a wafer, a vacuum processing chamber connected to the vacuum transport chamber, in which the wafer is processed, at least one lock chamber capable of storing the wafer therein, disposed between the atmosphere transport chamber the back surface side and the vacuum transport chamber, a controller for adjusting transport operations of taking out multiple wafers stored in a cassette disposed to a front surface side of the atmosphere transport chamber from the cassette, allowing the vacuum transport robot to sequentially transport the wafers to the vacuum processing chamber for processing the wafers, and returning the processed wafers to the cassette, a pusher arm disposed in the at least one lock chamber for receiving the wafer from the vacuum transport robot to support the wafer on a beam portion, or deliver the supported wafer, and a cooling plate disposed in a bottom portion of the at least one lock chamber for cooling the wafer which has been delivered from the beam portion of the pusher arm and placed on tip ends of multiple support pins. The pusher arm includes four pusher pins disposed at four positions, respectively around a center of the wafer to be placed on the horizontally extending beam portion, and a drive unit connected to the proximal part for vertically moving the beam portion. The cooling plate includes a recess portion in its center, into which the beam portion of the pusher arm which has been moved downward is stored. The support pins are positioned closer to an outer circumference side of the wafer on the cooling plate with respect to the center than the pusher pins of the pusher arm.

Advantageous Effects of Invention

The present invention ensures to provide the vacuum processing apparatus for improving productivity per unit installation area and processing efficiency.

DESCRIPTION OF EMBODIMENT

An example of the vacuum processing apparatus according to the present invention will be described in detail with reference to the drawings.

FIRST EXAMPLE

Figure 1:
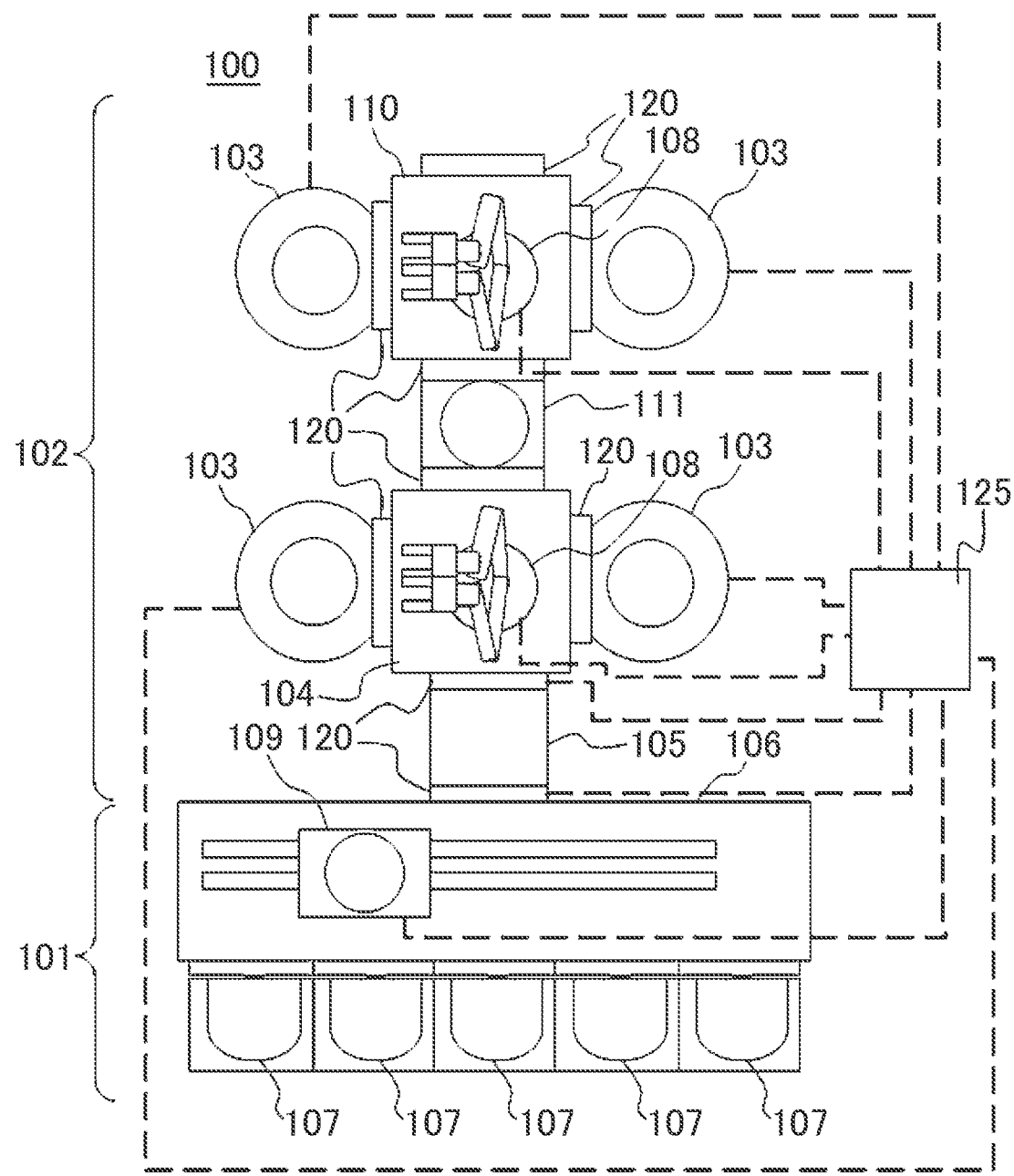
FIG. 1 is a schematic top view of a structure of a vacuum processing apparatus according to an example of the present invention.

FIG. 1 illustrates a structure of a vacuum processing apparatus 100 according to an embodiment of the present invention. FIG. 1 is a schematic top view of the structure of the vacuum processing apparatus according to the example of the present invention.

The vacuum processing apparatus 100 is mainly constituted by an atmospheric-side block 101 and a vacuum-side block 102. In the atmospheric-side block 101, a substrate-like sample to be processed, for example, the semiconductor wafer, under the atmospheric pressure is transported and positioned for storage. In the vacuum-side block 102, the substrate-like sample such as the wafer is transported under the pressure as a result of decompressing the atmospheric pressure, and the sample is processed in the predetermined vacuum processing chamber. A section for increasing or decreasing the pressure in the range from the atmospheric pressure to the vacuum pressure is disposed between the vacuum-side block 102 for performing the above-described transport and processing, and the atmospheric-side block 101 in the state where those blocks are connected while having the sample disposed inside.

The atmospheric-side block 101 includes a casing 106 which is formed as a substantially cuboid-shaped vessel provided with an atmosphere transport robot 109 therein. The casing includes an atmosphere transport chamber controlled at the inner pressure equal to or slightly higher than the atmospheric pressure around the vacuum processing apparatus 100 to accommodate the transported sample before and after processing. A plurality of cassette bases 107 are provided to the front surface side of the casing 106, on which cassettes each storing substrate-like samples (to be referred to as the wafer) such as the unprocessed semiconductor wafers to be processed for processing or cleaning are placed, respectively.

The vacuum-side block 102 includes a first vacuum transport chamber 104, a second vacuum transport chamber 110, and one or more lock chambers 105 between the atmospheric-side block 101 and the vacuum transport chambers. In the lock chamber, the wafers are handled between the atmospheric side and the vacuum side under the pressure between the atmospheric pressure and the vacuum pressure. An explanation will be made later referring to FIGS. 2 and 3.

Each of the first vacuum transport chamber 104 and the second vacuum transport chamber 110 is a unit including a vacuum vessel with a substantially rectangular planar shape. Those chambers as two units have different structures which can be regarded as substantially identical. A vacuum transport intermediate chamber 111 is a vacuum vessel which allows inner pressure to be decompressed to the vacuum degree equivalent to that of the other vacuum transport chamber or the vacuum processing chamber. The vacuum transport intermediate chamber connects the vacuum transport chambers so that the inner chambers are communicated with each other. Gate valves 120 are disposed between the vacuum transport intermediate chamber and the vacuum transport chambers, which open passages for communication with the inner chambers to allow transport of the wafers, and close the passages for separating the inside. As those gate valves 120 are closed, the vacuum transport intermediate chamber and the vacuum transport chambers may be sealed air-tightly.

The inner chamber of the vacuum transport intermediate chamber 111 includes a storage section disposed therein for horizontally holding the wafers while having a gap between surfaces of the respective wafers. Upon delivery of the wafer between the first and the second vacuum transport chambers 104, 110, the storage section serves as a relay chamber for temporarily storing the wafer. The wafer which has been transported by a vacuum transport robot 108 in one of the vacuum transport chambers is placed on the storage section, and then taken by the vacuum transport robot 108 in the other vacuum transport chamber into a vacuum processing chamber 103 connected to the vacuum transport chamber or the lock chamber 105.

The vacuum transport intermediate chamber 111 capable of storing wafers before or after processing therein is disposed between side walls as opposite surfaces of the first vacuum transport chamber 104 and the second vacuum transport chamber 110 while connecting the vacuum transport chambers with each other. The vacuum processing chambers 103 are connected to other surfaces of the vacuum transport chambers, each having its inner space decompressed. In the vacuum processing chamber 103, the transported wafer is processed in the decompressed state with plasma generated using processing gas which has been introduced into the inner space. In the example, the vacuum processing chamber 103 represents a unit including the vacuum vessel, a unit for generating electric fields and magnetic fields to be supplied to the processing chamber in the vacuum vessel for generating plasma, and an exhaust unit containing a vacuum pump for emission from the processing chamber as the space of the vacuum vessel to be decompressed. In the processing chamber, the process for etching and asking using plasma, or other process to be applied to the semiconductor wafer are executed. Pipelines through which the processing gas flows are connected to the respective vacuum processing chambers 103 so that the processing gas is supplied to the processing chamber in the vacuum vessel in accordance with the process to be executed.

The first vacuum transport chamber 104 is configured to be connectable to two vacuum processing chambers 103 to the maximum. In the example, two vacuum processing chambers 103 are connected. Meanwhile, the second vacuum transport chamber 110 is configured to be connectable to three vacuum processing chambers 103 to the maximum. In the example, two vacuum processing chambers 103 are connected. Each of the first vacuum transport chamber 104 and the second vacuum transport chamber 110 has an inner space as the transport chamber. In the first vacuum transport chamber 104, the first vacuum transport robot 108 is disposed in the center part of the inner space for transporting the wafer under the vacuum state to either the lock chamber 105, the vacuum processing chambers 103, or the vacuum transport intermediate chamber 111. Similarly, the second vacuum transport chamber 110 has the vacuum transport robot 108 disposed in the center part of the inner space for transporting the wafer to either the vacuum processing chamber 103 or the vacuum transport intermediate chamber 111.

In the first vacuum transport chamber 104, the wafer placed on an arm of the vacuum transport robot 108 is transported to/from either a wafer base in the vacuum processing chamber 103, the lock chamber 105, or the vacuum transport intermediate chamber 111. Passages are formed among the vacuum processing chambers 103, the lock chamber 105, the vacuum transport intermediate chamber 111, the first vacuum transport chamber 104 and the second vacuum transport chamber 110 for communication with one another by the air-tightly opening/closing gate valves 120. The passages are opened and closed by the respective gate valves 120.

In the vacuum processing apparatus according to the example as illustrated in FIG. 1, the wafer is processed under the same conditions including the processing time in all the vacuum processing chambers 103. The number of wafers to be transported per unit time in the lock chamber 105 is a value which is smaller than the number of wafers that can be processed per unit time in the vacuum processing chamber 103, and equal to or slightly smaller than the number of the wafers to be transported per unit time by the vacuum transport robot 108 in each of the vacuum transport chambers. This is attributed to the need of prolonging the time for reducing the temperature of the heated wafer through the asking process until it is ready for transport or storage in the cassette, that is, relatively long time for detaining the wafer in the lock chamber 105 for transporting the processed wafer from the lock chamber 105 to the atmospheric-side block 101.

The vacuum transport robot 108 (vacuum transport robot 1) disposed in the first vacuum transport chamber 104 is a machine that transports the unprocessed wafer introduced from the atmospheric-side block 101 to the vacuum-side block 102 to the target vacuum processing chamber 103 where the preliminarily set process prior to transport of the wafer is applied to the wafer. Meanwhile, the vacuum transport robot (vacuum transport robot 2) disposed in the second vacuum transport chamber 110 is a machine which transports the wafer transported by the vacuum transport robot 1 from the first vacuum transport chamber 104 to the vacuum transport intermediate chamber 111 to the vacuum processing chamber 103 connected to either the vacuum transport intermediate chamber 111 or the second vacuum transport chamber 110.

In the example, after finishing execution of the process to the wafer in any one of the vacuum processing chambers 103, the processed wafer is transported from the vacuum processing chamber 103 to the lock chamber 105. The wafer detaining time in the lock chamber 105 elapsing until it is discharged from the lock chamber 105 to the atmospheric-side block refers to the time taken from the timing when the decompressed lock chamber 105 having the wafer stored therein is boosted to the atmospheric pressure or the pressure that can be regarded as substantially equal thereto to the timing when the gate valve facing the atmospheric-side block 101 is opened to discharge the wafer. The wafer detention time in the lock chamber 105 is sufficiently longer than the time in which the transported wafer is processed in the vacuum processing chamber 103 and detained until it is discharged. In the example, the waiting time occurs for the vacuum transport robot 1 required to return all the processed wafers to the lock chamber 105 until the gate valve of the lock chamber 105 at the vacuum-side block 102 is opened to allow entry of the processed wafer held on the arm of the vacuum transport robot 1.

Figure 2:
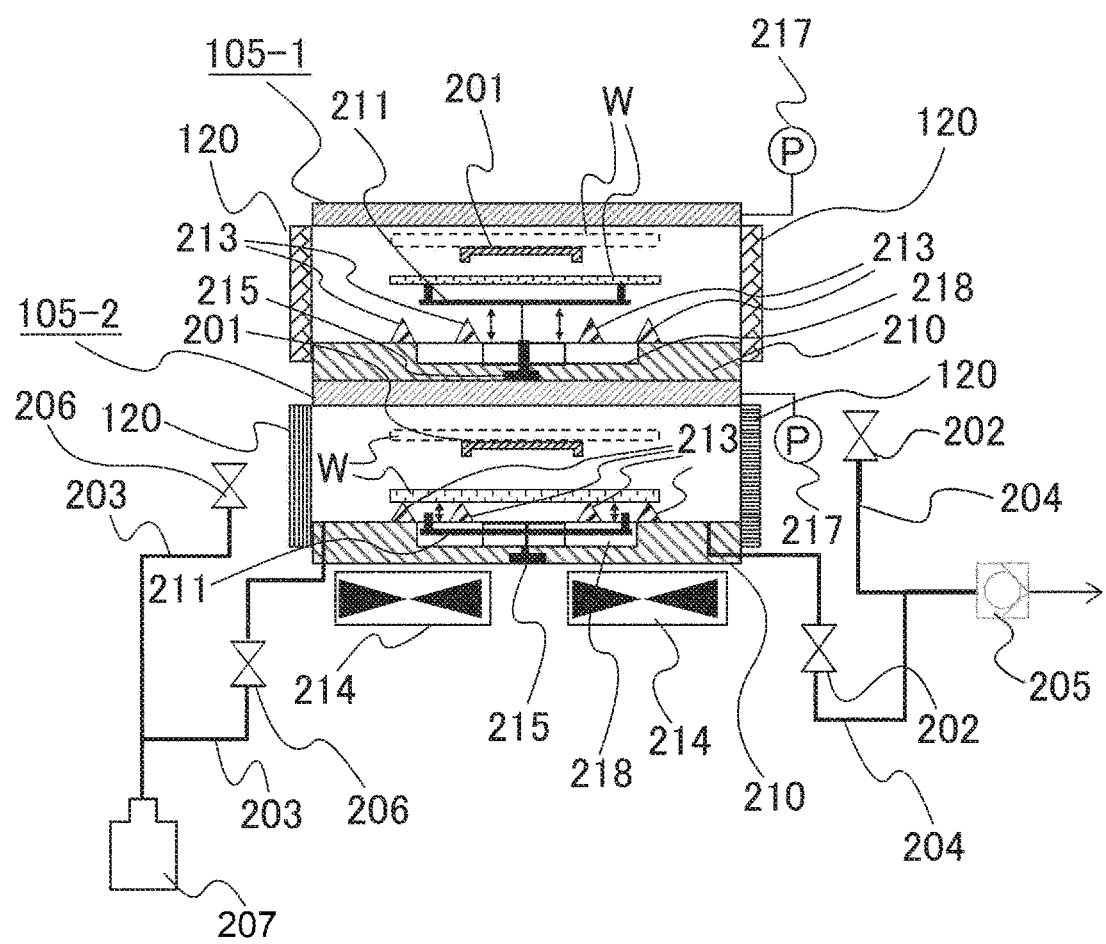
FIG. 2 is a schematic vertical sectional view of a structure of a lock chamber of the vacuum processing apparatus according to the example as illustrated in FIG. 1.
Figure 3:
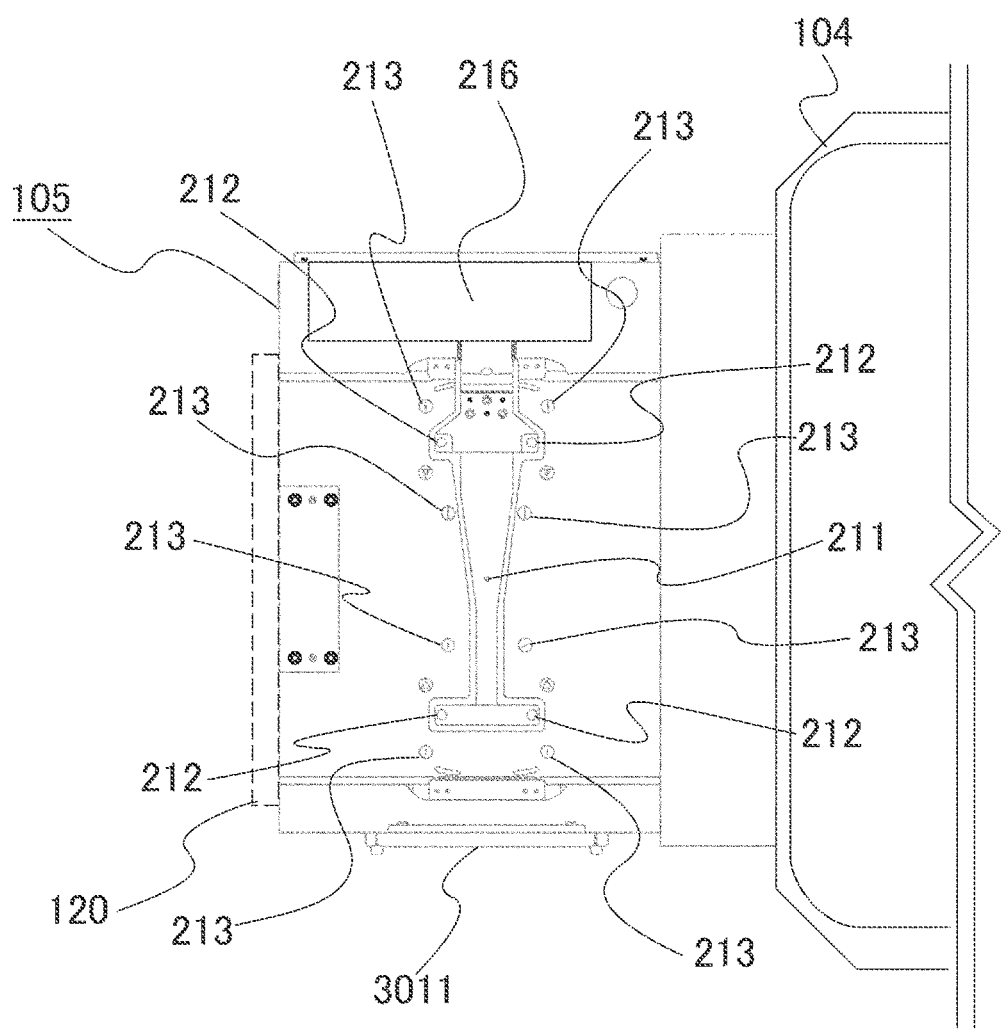
FIG. 3 is a schematic cross sectional view of the structure of the lock chamber of the vacuum processing apparatus according to the example as illustrated in FIG. 1.
Figure 4:
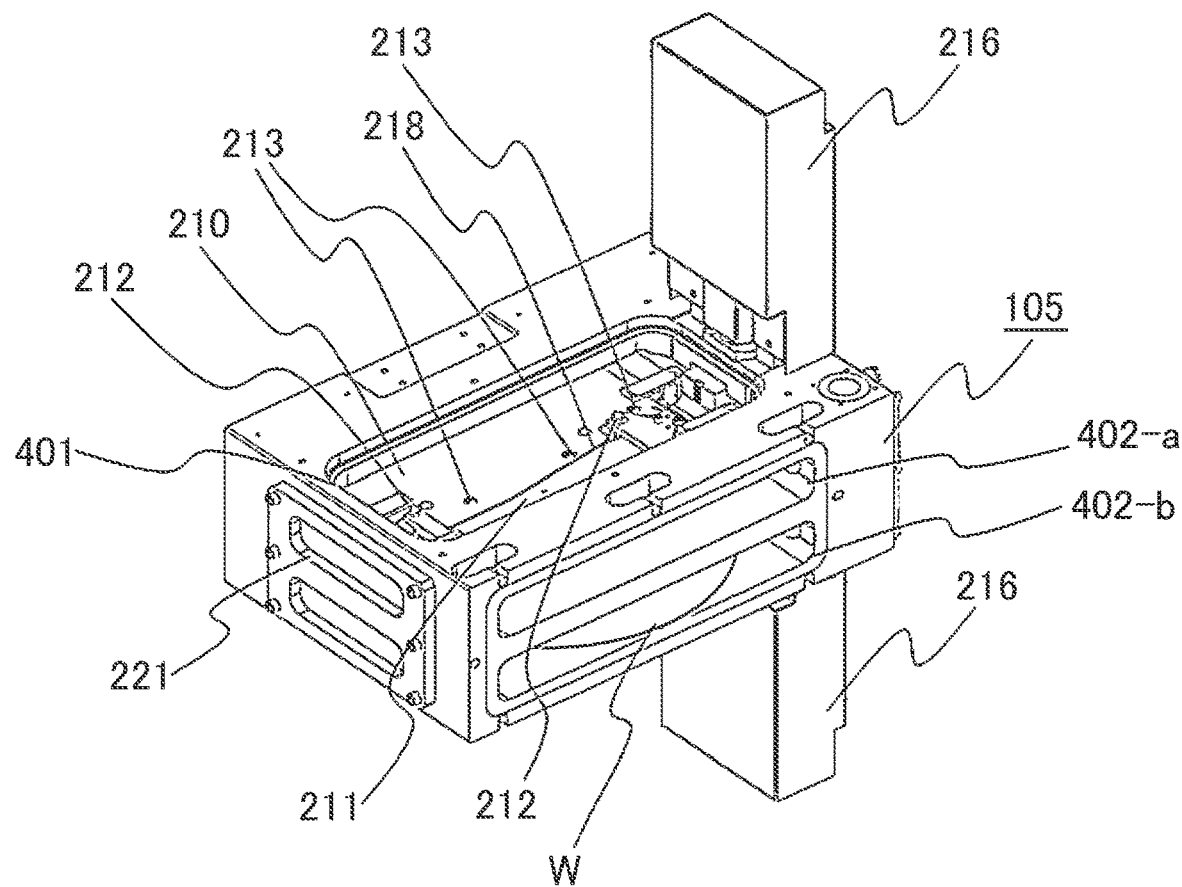
FIG. 4 is a schematic perspective view of the structure of the lock chamber as illustrated in FIG. 2, representing a modification of a wafer in the lock chamber according to the example as illustrated in FIG. 2.

Referring to FIGS. 2, 3, 4, the structure of the lock chamber 105 of the vacuum processing apparatus 100 as illustrated in FIG. 1 will be described. FIG. 2 is a schematic horizontal sectional view of the structure of the lock chamber of the vacuum processing apparatus according to the example as illustrated in FIG. 1. FIG. 3 is a schematic vertical sectional view of the structure of the lock chamber of the vacuum processing apparatus according to the example as illustrated in FIG. 1. FIG. 3 illustrates the lock chamber 105 as a top view including a partial cross section when seen from above. FIG. 4 is a schematic perspective view of the structure of the lock chamber as illustrated in FIG. 2.

The lock chamber 105 of the example includes a vacuum vessel constituted by two air-tightly separated chambers which are vertically piled up, that is, lock chambers 105-1 and 105-2 each provided with a purge line 203 and an exhaust line 204. The lock chambers 105-1, 105-2 include the gate valves 120 disposed between the casing 106 of the atmospheric-side block 101 and the first vacuum transport chamber 104 of the vacuum-side block 102.

Those gate valves 120 are driven by a not shown valve drive unit in accordance with instruction signals from a controller 125 to move up and down. They are disposed on the side walls of the vacuum vessel of the lock chamber 105 to communicate the inner storage chambers of the lock chambers 105-1, 105-2 with the space inside the casing 106 at the substantially atmospheric pressure, and the first vacuum transport chamber 104 which has been brought into a predetermined vacuum degree, respectively. Those gate valves abut on side wall surfaces around gate openings as the passages through which the wafer W is transported while having a seal member such as an O-ring intervening therebetween to air-tightly close or open the lock chambers 105-1, 105-2. Although not shown, the valve drive unit for the gate valve 120 that opens and closes communication of the gate for the lock chamber 105-2 is connected to the gate valve 120 at the upper part. The valve drive unit for the gate of the lock chamber 105-1 is connected to the gate valve 120 at the lower part.

A stage 201 for supporting the wafer W placed thereon is disposed at an upper part of each space for storing the wafer W inside the lock chambers 105-1, 105-2. A cooling plate 210 as a metal tabular member made of aluminum, silver, copper, or alloys thereof is disposed in each lower part below the stage 201 in the storage space of the lock chambers 105-1, 105-2. The cooling plate having a rectangular or quadrate planar shape in the top view constitutes the bottom surface of the storage space, and includes a plurality of support pins 213 (in the example, three or more) having the respective tip ends on which the wafer W is placed. The stage 201 and the cooling plate 210 having the support pins 213 allow the lock chambers 105-1, 105-2 to hold multiple wafers W either processed or unprocessed (in the example, two wafers) inside the storage spaces. The wafers W may be vertically piled up while having a gap between the respective wafers.

Each of the lock chambers 105-1, 105-2 is connected to the exhaust line 204 which is communicated with the storage space, on which an exhaust valve 202 and a vacuum pump 205 for rough pumping such as the rotary pump are provided. The exhaust valve 202 is disposed between the lock chamber 105-1 (or 105-2) and the vacuum pump 205. Each of the lock chambers 105-1, 105-2 is connected to the purge line 203 for circulating dried noble gases such as nitrogen gas therein, which is communicated with the storage space via a valve 206 disposed on the purge line 203. Upon transport of the unprocessed wafer W from the atmosphere transport chamber in the casing 106 to the stage 201 of the lock chamber 105-1 (or 105-2), particles and moisture enter the lock chamber 105-1 (or 105-2) from the atmosphere transport unit to adhere to the inner surface of the storage chamber of the lock chamber 105-1 (or 105-2). This may cause the risk of generating foreign substances. In order to suppress the risk, a gas source 207 including a reservoir such as a tank supplies dried gas via the purge line 203 so that the inner pressure of the storage chamber is made higher than that of the atmosphere transport chamber.

When bringing the inner pressure of the storage chamber in the lock chamber 105-1 or 105-2 into the predetermined vacuum degree, the gate valve 120 between the lock chamber and the pressure transport chamber is air-tightly closed to seal the storage space. The exhaust valve 202 is then opened to communicate a vacuum pump 209 with the storage space via the exhaust line 204 so as to start decompressing the storage space. When one of pressure gauges 217 connected to the lock chambers 105-1 and 105-2, which is communicated with the storage space detects the decompression to the predetermined vacuum degree, the exhaust valve 202 is closed to complete decompression. The gate valve 120 between the storage chamber in the lock chamber and the vacuum transport chamber 104 is then opened.

The arm tip of the vacuum transport robot 108 in the first vacuum transport chamber 104 enters the storage space in one of the lock chambers below the stage 201 via the gate opened by the gate valve 120 so that the wafer W held on the stage 201 is delivered to the upper surface of the hand of the arm tip which has been moved upward. The arm then contracts to be transported into the first vacuum transport chamber 104 outside the lock chamber 105 together with the wafer W. The wafer W is further transported toward the target vacuum processing unit 103.

Meanwhile, after execution of the plasma process or asking process, the high-temperature wafer W is returned to the lock chamber 105-1 or 105-2 again. In other words, upon opening of the gate valve 120 between the processing chamber of the vacuum processing unit 103 which has processed the wafer W and the first vacuum transport chamber or the second vacuum transport chamber 110 connected to the vacuum processing unit 103, the wafer W transported by the vacuum transport robot 108 from the processing chamber is placed on the arm operated by the vacuum transport robot 108 in the first vacuum transport chamber 104, and transported between the stage 201 and the support pins of the cooling plate 210 in the storage space of either the lock chamber 105-1 or 105-2 in the absence of the wafer W on the cooling plate 210 so that the processed wafer W is storable. The arm moves downward to exit from the lock chamber so that the wafer W is delivered to the support pins 213 of the cooling plate 210.

Then the gate valve 120 between the lock chamber and the first vacuum transport chamber 104 is closed to seal the storage space. The dried gas is supplied from the purge line 203 to increase the inner pressure of the storage space to a predetermined value slightly higher than the atmospheric pressure. When the pressure gauge 217 detects the pressure increase to the predetermined value, the purge line 203 is closed by the valve thereon to finish the boosting step. The gate valve 120 at the side of the atmosphere transport chamber is opened for taking out the processed wafer W on the arm of the atmosphere transport robot 109 as the transporting robot that has entered the lock chamber. The wafer W is returned to its previous position of the original cassette on the cassette base 107.

In the example, in order to prevent the problem caused by the temperature of the processed wafer W stored in the lock chamber 105-1 or 105-2, which is returned to the previous position of the original cassette in the atmospheric-side block 101, the stored wafer W is cooled in the storage space by decreasing the temperature to the predetermined value. For the purpose of raising the throughput of processing the wafer W by reducing the time necessary for executing the cooling step, each of the lock chambers 105-1, 105-2 is provided with a pusher arm 211 having a beam portion with high heat conductivity made of, for example, aluminum, silver, copper, or alloys thereof. A plurality of ventilators 214 are disposed below the bottom surface of the cuboid-shaped vessel of the lock chamber 105. Ambient air around the vacuum processing apparatus 100 is sprayed from the ventilators 214 for cooling the vessel of the lock chamber 105, the cooling plate 210 and the pusher arm 211, which are disposed inside and thermally communicable (thermally connected) to the vessel as well as the wafer W held above those elements. A temperature sensor 215 produced using platinum is disposed inside the cooling plate 210. Output signals of the temperature sensor 215, indicating the detected temperature are transmitted to the controller 125. Based on the signals, the temperature of either the cooling plate 210, the pusher arm 211, or the wafer W held above those elements is detected.

Prior to placement on the support pins 213 of the cooling plate 210, the wafer W transported by the vacuum transport robot 108 into the inner storage space of either the lock chamber 105-1 or 105-2 (hereinafter referred to simply as lock chamber 105) is delivered to the pusher arm 211. The wafer W is delivered from the pusher arm 211 to the support pins 213 on the cooling plate 210.

Structures of the pusher arm 211 and the cooling plate 210 will be described referring to FIGS. 3, 4 in addition to FIG. 2.

Referring to FIG. 3, an explanation will be made with respect to structures of the pusher arm 211 and the cooling plate 210 disposed inside the lock chamber 105 of the example for cooling the wafer W. FIG. 3 is a schematic cross sectional view of the structure of the lock chamber according to the example as illustrated in FIG. 2. In the drawing, the right-side end of the lock chamber 105 on the drawing is connected to the side wall of the first vacuum transport chamber 104 via the not shown gate valve 120 intervening therebetween. The not-shown casing 106 is connected to the left-side end of the lock chamber on the drawing via the gate valve 120 intervening therebetween.

In the example, in order to reduce the time for cooling the wafer W to reach the predetermined temperature, each of the lock chambers 105-1, 105-2 includes the pusher arm 211 made of material with high heat conductivity such as aluminum, silver, copper, and alloys thereof. The pusher arm 211 includes the beam portion having three or more (in the example, four) pusher pins 212 disposed on the upper surface for supporting the wafer W placed thereon. One end of the beam portion is connected to a pusher drive unit 216 including an actuator which vertically expands to make the lower end vertically movable. The pusher drive unit 216 is disposed above or below (not shown in FIG. 3) the one end of the lock chamber 105.

In the example, the beam portion of the pusher arm 211 horizontally extends, having a horizontal axis expanding into the storage chamber of the lock chamber 105-1 or 105-2 to intersect the direction in which each arm tip end of the vacuum transport robot 108 and the atmosphere transport robot 109 enters or exits from the lock chamber 105-1 (or 105-2) (in the example, the horizontal axis of the beam portion is perpendicular to the arm expanding/contracting direction). In the state where the wafer W is held above the beam portion, the pusher arm 211 which is horizontally moved by the pusher drive unit 216 in the storage chamber is held at a position so as not to come in contact or collide with the beam portion and the wafer W upon entry or exit of each arm of the vacuum transport robot 108 and the atmosphere transport robot 109.

As FIG. 3 illustrates, for the purpose of allowing the high-temperature wafer W to be held, multiple pairs of pusher pins 212 are disposed on the upper surface of the beam portion of the pusher arm 211 at a leading part and a proximal part of the horizontally extending beam portion. They are positioned at both sides of the axis of the beam portion in the horizontal direction when seen from above. The distance between the tip end of the pusher pin 212 and the upper surface of the beam portion is made larger than the thickness of the tip end of each arm of the vacuum transport robot 108 and the atmosphere transport robot 109 in the vertical direction. In the state where the wafer W is held on the tip ends of the pusher pins 212, a gap is formed between the back surface of the wafer W and the upper surface of the beam portion so as to allow each tip end of the vacuum transport robot 108 and the atmosphere transport robot 109 to enter or exit from the gap.

The proximal part as the upper end of the pusher arm 211 as illustrated in FIG. 3 is connected to the pusher drive unit 216. The pusher drive unit 216 attached to the end (upper end in FIG. 3) of the cuboid-shaped vacuum vessel constituting the lock chamber 105 has its position fixed. The beam portion of the pusher arm 211 is connected to the end of the vertically expanding/contracting or movable part for vertical movement in the space of the lock chamber 105. Upon delivery of the wafer W to/from the arm tip end of the vacuum transport robot 108 or the atmosphere transport robot 109 in accordance with the instruction signal from the controller 125, the pusher drive unit 216 keeps the arm tip end which enters or exits from the storage space at the height position between the upper ends of the pusher pins 212 and the upper surface of the beam portion so as not to come in contact or collide therewith in the range from the stage 201 to the cooling plate 210 in the storage space. This allows the arm tip end to move between the wafer W on the pusher pins 212 and the upper surface of the beam portion.

A viewing window 221 is formed in the side wall surface of one end of the vessel of the lock chamber 105, which is opposite the end attached to the pusher drive unit 216. The window member made of the translucent material, for example, quartz or acryl allows the storage space in the lock chamber 105 to be externally observed.

In the example, the arm tip end which holds the wafer W is transported to the position above the four pusher pins 212 over the cooling plate 210, and stopped. The arm tip end is moved downward to the position where the wafer W is supported by the tip ends of those pusher pins 212, and the arm tip end does not come in contact with the pusher pins 212 of the pusher arm 211 and the upper surface of the beam portion for delivery of the wafer W to the pusher pins 212 of the pusher arm 211. Thereafter, the arm contracts to allow its tip end to separate from the area between the pusher arm 211 and the wafer W, and to exit from the storage space. Alternatively, in the state where the pusher arm 211 which holds the wafer W on the pusher pins 212 is positioned above the cooling plate 210, the arm tip end of the vacuum transport robot 108 or the atmosphere transport robot 109 enters between the wafer W in the storage space and the upper surface of the beam portion of the pusher arm 211 without coming in contact or colliding therewith, and is stopped. Then the arm tip end is moved upward so that the wafer W is further lifted while having its back surface in contact with the tip end. The arm tip end is moved to a position apart from the tip ends of the pusher pins 212 for receiving the wafer W. The arm is contracted to ensure exit from the storage space while keeping the above-described state.

Each of the lock chambers 105-1, 105-2 of the example has the cooling plate 210 as the metal tabular member with high heat conductivity for constituting the bottom part of the storage space. The cooling plate 210 has a recess portion 218 in its center. The recess portion 218 is formed to accommodate insertion of the beam portion of the pusher arm 211 which is driven to move downward by the pusher drive unit 216 so that the beam portion is stored. The recess portion is a region slightly wider than the region derived from virtually projecting the planar shape of the pusher arm 211 downward to the upper surface of the cooling plate 210 from above, while being recessed sufficiently deeper than the maximum thickness of the beam portion of the pusher arm 211 in the vertical direction.

The multiple support pins 213 (in the example, at least eight) are disposed on the upper surface of the cooling plate 210 around the recess portion 218. The pusher drive unit 216 drives the pusher arm 211 to be stored in the recess portion 218 at the lowermost position. In this state, the height of the upper end of the pusher pin 212 is made lower than the support pin 213. The back surface of the wafer W held on the pusher pins 212 of the pusher arm 211 comes in contact with the support pins 213 as the pusher arm 211 moves toward the bottom part of the recess portion 218. When the pusher arm 211 further moves downward, the wafer is separated from the pusher pins 212, and delivered to tip ends of the multiple support pins 213, and placed thereon.

The surface of the support pin 213 is processed to have its surface roughness Ra of 6.3 μm or lower to increase its area in contact with the wafer W for efficient heat transfer. The support pin 213 has a height dimension which holds the upper and lower surfaces of the wafer W placed on the tip end parallel to the upper surface of the cooling plate 210 that surrounds the support pins 213. The upper surface of the cooling plate 210 is produced using the material with high heat conductivity such as aluminum, silver, copper and alloys thereof. In the state where the wafer W is held on the support pins 213, heat of the outer circumference of the wafer W is efficiently transferred by heat conduction via the support pins 213 and radiation between both sides of the recess portion 218 and the peripheral cooling plate 210. Heat of the center of the wafer W is efficiently transferred by radiation with the pusher arm 211 stored in the recess portion 218.

In the example, the heated wafer W processed in one of the plasma processing units 103 is transported into one of the lock chambers 105. The lock chamber 105 is then sealed, to which the dried noble gas is supplied, and boosted. In the storage vessel of the lock chamber 105, the wafer W is placed on the support pins 213, and held until its temperature reaches the value in the predetermined range. The pusher arm 211 is driven by the pusher drive unit 216 to move upward in accordance with the instruction signal from the controller 125 so that the wafer W is held on the pusher pins 212, and lifted upward from above the cooling plate 210. The gate valve 120 at the side of the atmospheric-side block 101 is opened to release the storage chamber of the lock chamber 105 at the pressure slightly higher than the atmospheric pressure so that the wafer W is delivered to the arm of the entering atmosphere transport robot 109, and taken out from the storage chamber of the lock chamber 105.

The lock chamber 105 as illustrated in FIG. 4 has its side wall at the lower side indicated by an arrow connected to the first vacuum transport chamber 104, and its side wall at the upper side indicated by an arrow connected to the casing 106 of the atmospheric-side block 101. As illustrated in FIG. 1, the lock chamber 105 has two ends in the front-rear direction connected to the first vacuum transport chamber 104 via the gate valve 120, and connected to the casing 106 of the atmospheric-side block 101 via the gate valve 120, respectively. The drawing omits those gate valves 120, and drive units connected thereto at the upper and lower sides for vertically moving the gate valves 120.

The lock chamber is the vacuum vessel with the cuboid shape, or the shape approximated to be substantially equated with the cuboid shape. The inner space of the vacuum vessel is divided into two upper and lower chambers each having the storage space for storing multiple wafers. The stage 201, the cooling plate 210, the pusher arm 211, and the support pins 213, which have been described referring to FIGS. 2 and 3 are disposed inside the storage space.

The viewing window 221 is formed in the side wall of the lock chamber 105 at the left end on the drawing. Two window members are provided corresponding to the two upper and lower storage spaces. Two pusher drive units 216 are vertically disposed at the right end of the vessel of the lock chamber 105 on the drawing. The pusher drive units 216 are connected via a vertically extending shaft outside the vessel. The vertical shaft of the pusher drive unit 216 extends along a shaft vertically moved by a drive machine disposed inside a cuboid outer shell of the pusher drive unit 216. The proximal part of the pusher arm 211 is connected to an upper or lower end of the shaft. The pusher arm 211 is vertically moved in accordance with the vertical movement of the shaft driven by the pusher drive unit 216.

The lock chamber 105 of the example has its inner section of the cuboid-shaped vacuum vessel vertically divided into two upper and lower lock chambers 105-1, 105-2. The pusher arm 211 and the cooling plate 210 on the bottom surface of the storage chamber in each of the lock chambers 105-1, 105-2 include the multiple pusher pins 212 and the support pins 213 disposed on the upper surfaces of those members, respectively.

The lock chambers 105-1, 105-2 include gates through which the wafer W passes at ends of side wall surfaces facing the casing 106 and the first vacuum transport chamber 104, respectively. FIG. 4 illustrates gates 402-a, 402-b which are formed in the side wall surface facing the first vacuum transport chamber 104 in the vertical direction while having a gap therebetween. Not shown two vertically disposed gate valves 120 at the side facing the first vacuum transport chamber 104 abut on the side wall surfaces of the lock chambers 105-1, 105-2, respectively around the openings of those gates 402-a, 402-b for air-tight sealing inside and outside the gates 402-a, 402-b.

A viewing window is formed in the upper part of the vessel of the upper lock chamber 105-1 to allow the user to observe the inside of the vessel via the translucent window member made of quartz or acryl. FIG. 4 illustrates only a through hole 401 to which the upper viewing window is attached. FIG. 4 illustrates the cooling plate 210 disposed on the bottom surface of the storage chamber of the upper lock chamber 105-1, and the pusher arm 211 stored in the recess portion 218 of the cooling plate 210 as well as the pusher pins 212 and the support pins 213 respectively disposed on the upper surfaces of those members, which are viewed from the through hole 401.

The temperature distribution of the wafer W to be cooled is not uniform in the in-plane direction. The temperature distribution of the wafer W, for example, high temperature at the center part and low temperature at the outer circumference part, or vice versa is determined by conditions of the etching process or the asking process. Large variation in the temperature of the wafer W in the in-plane direction fluctuates the expansion coefficient owing to heat at the center or the outer circumference of the wafer W, resulting in warpage of the wafer W in the lock chamber 105-1 (or 105-2) as illustrated in FIG. 5.

Figure 5:
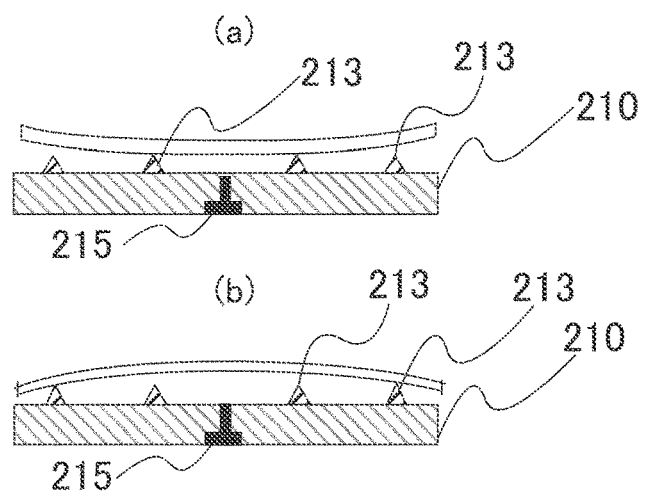
FIG. 5 is a vertical sectional view of arrangement of the wafer in the lock chamber and the inner storage chamber of the vacuum processing apparatus according to the example as illustrated in FIG. 1.

FIG. 5 is a schematic vertical sectional view of placement of the wafer in the inner storage chamber of the lock chamber in the vacuum processing apparatus according to the example as illustrated in FIG. 1.

The warpage of the wafer W held on the pusher pins 212 of the pusher arm 211 or the support pins 213 of the cooling plate 210 as described above brings the end of the wafer W closer to come in contact with the surface of the pusher arm 211 or the cooling plate 210, or shifts the position of the wafer W horizontally from the contact part as a fulcrum to drop from the pusher arm 211 which lifts and supports the wafer W above the cooling plate 210. This may cause the risk of positional misalignment, cracking, and chipping of the wafer W. In the example, when seen from above, the number of the support pins 213 on the upper surface of the cooling plate 210 at the center side of the wafer W to be disposed on four pusher pins 212 on the pusher arm 211 is at least three or more. When seen from above, the number of the support pins 213 disposed at the outer circumference side in the projection region of the wafer W is at least three of more.

In the example, each pair of pusher pins 212 is disposed at the proximal part (right end of FIG. 4) and the leading part (left end) of the pusher arm 211, respectively. When seen from above, the pusher pins are disposed line-symmetrical with the horizontal axis of the beam portion of the pusher arm 211. In the state where the wafer W is held on the pusher pins, at least each pair is equally positioned radially from the center of the wafer W. The support pins 213 at the center side are positioned between the pusher pins 212 at the proximal part and the leading part along the axis of the beam portion of the pusher arm 211. Radial positions of the support pins from the point corresponding to the center of the wafer W define a range narrower than the one defined by the pusher pins 212. The support pins 213 at the outer circumference side are disposed closer to the proximal side (right end on the drawing) than the pusher pins 212 on the proximal part, and are disposed closer to the leading side (left end on the drawing) than the pusher pins 212 on the leading part.

In the state where the pusher arm 211 is driven by the pusher drive unit 216 to be stored in the recess portion 218 at the lowermost position, the tip end of the support pin 213 is positioned higher than the tip end of the pusher pin 212. Referring to FIG. 5, the apparatus of the example is configured to change positions of the support pins 213 for supporting the wafer W in accordance with warpage of the wafer W so as to be effectively cooled. If the outer circumferential edge of the wafer W becomes higher than the center part to cause the concave warpage, the wafer is supported with the support pins 213 at the center side. If the outer circumferential edge of the wafer W is lowered to cause the convex warpage, the wafer W is supported by the support pins 213 at the outer circumference side.

This makes it possible to prevent collision of the wafer W with the cooling plate 210 and the pusher arm 211 upon its delivery therebetween so as to lessen the problem of cracking, chipping, fall, and damage of the wafer W. The distance between the high-temperature part of the wafer W and the cooling plate 210 may be decreased to allow reduction in the time for efficient heat transfer by radiation until the temperature of the wafer W is reduced to the predetermined value. Reducing the temperature difference may solve the problem of warpage of the wafer W so that the clearance from the cooling plate 210 becomes uniform.

In the example, when the controller 125 detects completion of the etching process or the asking process to the unprocessed wafer W transported in arbitrary one of the plasma processing units 103, the gate valve 120 between the plasma processing unit 103 and the chamber connected thereto either the first vacuum transport chamber 104 or the second vacuum transport chamber 110 is opened in accordance with the instruction signal from the controller 125. The processed wafer W is then taken out and transported to the lock chamber 105.

The wafer W enters the storage space in the lock chamber 105 by opening the gate valve 120 for opening and closing the gate which communicates one of the lock chambers 105 that can store the wafer W and the first vacuum transport chamber 104. The wafer W on the arm tip end of the vacuum transport robot 108 is transported to the position above the pusher arm 211. The pusher arm 211 is driven by the pusher drive unit 216 to move upward. The wafer W is lifted from the arm of the vacuum transport robot 108, and placed on the pusher pins 212 of the pusher arm 211 while having the gap from the upper surface of the beam portion of the pusher arm 211. The arm of the vacuum transport robot 108 then exits to the inside of the first vacuum transport chamber 104 from the lock chamber 105. The gate valve 120 air-tightly closes the lock chamber 105 for sealing the storage space.

When the gate valve 120 is closed, in response to the instruction signal from the controller 125, the pusher drive unit 216 moves the pusher arm 211 downward to the lowermost position so that the pusher arm 211 is stored in the recess portion 218 of the cooling plate 210. The wafer W on the pusher pins 212 having the height lowered is delivered to the support pins 213 to be held thereon while having a gap from the cooling plate 210. As the ventilator 214 sprays air to the metal vacuum vessel of the lock chamber 105, the cooling plate 210 is cooled as well as the vacuum vessel of the lock chamber 105.

The dried noble gas such as nitrogen gas is introduced into the storage space through the purge line 203 to increase the inner pressure to the atmospheric pressure or the pressure slightly higher than the atmospheric pressure. Increase in the pressure of the storage space accelerates heat transfer between the wafer W and the cooling plate 210 or the pusher arm 211. The temperature decrease ratio of the wafer W may be increased. The controller 125 detects the temperature of the cooling plate 210 or the wafer W at predetermined time intervals using outputs from the temperature sensor 215.

After the controller 125 detects that the temperature has reached the predetermined value, the pusher drive unit 216 is activated in response to the instruction signal from the controller 125 so that the pusher arm 211 is moved upward from its storage position in the recess portion 218 to the position at the height sufficient to deliver the wafer to the arm of the atmosphere transport robot 109 entering the storage space. When the gate valve 120 between the casing 106 and the storage space is opened in the above-described state, the inside of the storage space of the lock chamber 105 is communicated with the inside of the casing 106. The arm of the atmosphere transport robot 109 enters the gap between the wafer W and the pusher arm 211 in the storage space through the gate, and receives the lifted wafer W. The atmosphere transport robot 109 contracts the arm to transport the wafer W into the casing 106. The gate valve 120 is then air-tightly closed again to seal the inside of the lock chamber 105. The wafer W is returned from the lock chamber 105 to its previous position in the original cassette.

The controller 125 adjusts the cooling time of the wafer W in accordance with the temperature of the wafer W detected using the temperature sensor 215 upon storage in the lock chamber 105 so that the waiting time in the lock chamber 105 for transport becomes minimum.

In the state where the pusher arm 211 is at the position for delivering the wafer to the atmosphere transport robot 109, the controller 125 allows the temperature sensor 215 to detect the outer wall temperature of the lock chamber 105-1 (or 105-2) connected to the cooling plate 210. It is further determined whether cooling of the wafer W in the lock chamber 105 bottlenecks the process applied to the wafer W in the vacuum processing apparatus 100 based on the difference between the detected temperature and the atmospheric temperature. The rotational frequency of the ventilator 214 is adjusted in accordance with the determination result. The controller 125 may be configured to stop operation of the ventilator 214 to execute the control that allows the individual operation so that the temperature gradient upon cooling of the wafer W is optimized.

The present invention is not limited to the example as described above, but includes various modifications. For example, the example has been described in detail for readily understanding of the present invention which is not necessarily limited to the one equipped with all structures as described above. It is possible to add, remove, and replace the other structure to, from and with a part of the respective structures.

LIST OF REFERENCE SIGNS

101: atmospheric-side block
102: vacuum-side block
103: plasma processing unit
104: first vacuum transport chamber
105: lock chamber
106: casing
107: cassette base
108: vacuum transport robot
109: atmosphere transport robot
110: second vacuum transport chamber
111: vacuum transport intermediate chamber
120: gate valve
201: stage
202: exhaust valve
203: purge line
204: exhaust line
205: vacuum pump
210: cooling plate
211: pusher arm
212: pusher pin
213: support pin
214: ventilators
215: temperature sensor
216: drive unit

The invention claimed is:
1. A vacuum processing apparatus, comprising:
an atmosphere transport chamber;
at least one vacuum transport chamber which is disposed at a back surface side of the atmosphere transport chamber, in which a vacuum transport robot is disposed for transporting a wafer;
a vacuum processing chamber connected to the vacuum transport chamber, in which the wafer is processed;
at least one lock chamber capable of storing the wafer therein, disposed between the atmosphere transport chamber the back surface side and the vacuum transport chamber;
a controller for adjusting transport operations of taking out multiple wafers stored in a cassette disposed to a front surface side of the atmosphere transport chamber from the cassette, allowing the vacuum transport robot to sequentially transport the wafers to the vacuum processing chamber for processing the wafers, and returning the processed wafers to the cassette;
a pusher arm disposed in the at least one lock chamber for receiving the wafer from the vacuum transport robot to support the wafer on a beam portion, or deliver the supported wafer; and
a cooling plate disposed in a bottom portion of the at least one lock chamber for cooling the wafer which has been delivered from the beam portion of the pusher arm and placed on tip ends of multiple support pins, wherein
the pusher arm includes four pusher pins disposed at four positions, respectively around a center of the wafer to be placed on the horizontally extending beam portion, and a drive unit connected to a proximal part for vertically moving the beam portion, the cooling plate includes a recess portion in its center, into which the beam portion of the pusher arm which has been moved downward is stored, and the support pins are positioned closer to an outer circumference side of the wafer on the cooling plate with respect to the center than the pusher pins of the pusher arm.

2. The vacuum processing apparatus according to claim 1, wherein each one of the pusher pins is disposed at both sides of an axis of the beam portion in a horizontal direction at a leading part and a proximal part of the beam portion of the pusher arm.

3. The vacuum processing apparatus according to claim 2, wherein:

the beam portion of the pusher arm is extendingly provided in a direction intersecting a direction in which the vacuum transport robot enters or exits from the at least one lock chamber; and in a state where the wafer is held by the beam portion, the vacuum transport robot enters or exits from a space between the beam portion and the wafer.

4. The vacuum processing apparatus according to claim 2, wherein the at least one lock chamber comprises a first lock chamber connected to the atmosphere transport chamber and a second lock chamber connected to the vacuum transport chamber, and wherein the first and second lock chambers are arranged to be vertically piled up.

5. The vacuum processing apparatus according to claim 2, further comprising a ventilator disposed outside the at least one lock chamber for vertical air circulation along a surface of an outer wall of the at least one lock chamber, wherein the cooling plate is thermally connected to the outer wall of the at least one lock chamber and is cooled by the air circulation by the ventilator.

6. The vacuum processing apparatus according to claim 2, further comprising a temperature sensor connected to the cooling plate for detecting a temperature of the cooling plate; and a controller for adjusting operations of the pusher arm in accordance with the temperature of the cooling plate or the wafer, which is detected based on an output from the temperature sensor.

7. The vacuum processing apparatus according to claim 1, wherein:

the beam portion of the pusher arm is extendingly provided in a direction intersecting a direction in which the vacuum transport robot enters or exits from the at least one lock chamber; and in a state where the wafer is held by the beam portion, the vacuum transport robot enters or exits from a space between the beam portion and the wafer.

8. The vacuum processing apparatus according to claim 1, wherein the at least one lock chamber comprises a first lock chamber connected to the atmosphere transport chamber and a second lock chamber connected to the vacuum transport chamber, wherein the first and second lock chambers are arranged to be vertically piled up.

9. The vacuum processing apparatus according to claim 1, further comprising a ventilator disposed outside the at least one lock chamber for vertical air circulation along a surface of an outer wall of the at least one lock chamber, wherein the cooling plate is thermally connected to the outer wall of the at least one lock chamber and is cooled by the air circulation by the ventilator.

10. The vacuum processing apparatus according to claim 1, further comprising a temperature sensor connected to the cooling plate for detecting a temperature of the cooling plate; and a controller for adjusting operations of the pusher arm in accordance with the temperature of the cooling plate or the wafer, which is detected based on an output from the temperature sensor.

* * * * *